United States Patent
Seo et al.

(10) Patent No.: US 11,196,023 B2
(45) Date of Patent: Dec. 7, 2021

(54) DISPLAY DEVICE HAVING UNDERCUT GROOVE FILLED WITH ENCAPSULATION LAYER

(71) Applicant: SAMSUNG DISPLAY CO., LTD., Yongin-si (KR)

(72) Inventors: Junghan Seo, Yongin-si (KR); Wooyong Sung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 77 days.

(21) Appl. No.: 16/710,910

(22) Filed: Dec. 11, 2019

(65) Prior Publication Data
US 2020/0328376 A1     Oct. 15, 2020

(30) Foreign Application Priority Data
Apr. 11, 2019   (KR) .................. 10-2019-0042670

(51) Int. Cl.
*H01L 51/52*     (2006.01)
*H01L 27/32*     (2006.01)

(52) U.S. Cl.
CPC ...... *H01L 51/5253* (2013.01); *H01L 27/3246* (2013.01)

(58) Field of Classification Search
CPC ................... H01L 51/5253; H01L 27/3246
See application file for complete search history.

(56) References Cited

U.S. PATENT DOCUMENTS

| | | | |
|---|---|---|---|
| 9,329,435 B2 | 5/2016 | Park et al. | |
| 9,818,807 B2 | 11/2017 | Park | |
| 10,050,223 B2* | 8/2018 | Im | H01L 51/5228 |
| 2011/0156578 A1* | 6/2011 | Jeon | H01L 51/5253 |
| | | | 313/506 |
| 2016/0064685 A1* | 3/2016 | Kim | B32B 37/003 |
| | | | 257/40 |
| 2018/0120620 A1* | 5/2018 | Shim | H01L 27/3258 |
| 2018/0151831 A1* | 5/2018 | Lee | H01L 27/3223 |
| 2018/0190724 A1 | 7/2018 | Kang | |

(Continued)

FOREIGN PATENT DOCUMENTS

| | | |
|---|---|---|
| KR | 10-2015-0024471 | 3/2015 |
| KR | 10-2015-0027448 | 3/2015 |

(Continued)

*Primary Examiner* — Lex H Malsawma
(74) *Attorney, Agent, or Firm* — F. Chau & Associates, LLC

(57) ABSTRACT

A display device includes a substrate that includes a display area and a peripheral area that surrounds the display area; a display element disposed in the display area and that includes a pixel electrode, an emission layer, and an opposite electrode; a thin-film encapsulation layer that covers the display element and includes a first inorganic encapsulation layer, an organic encapsulation layer, and a second inorganic encapsulation layer; and at least one groove formed in the peripheral area, wherein at least a portion of the thin-film encapsulation layer fills the at least one groove, wherein the at least one groove is concave into a multi-layer structure that includes a first layer and a second layer disposed on the first layer, and the at least one groove has an undercut structure in which the second layer protrudes toward a center of the at least one groove.

18 Claims, 12 Drawing Sheets

(56) References Cited

U.S. PATENT DOCUMENTS

2018/0190934 A1\* 7/2018 Choi .................. H01L 27/3246
2018/0336808 A1 11/2018 Lee et al.

FOREIGN PATENT DOCUMENTS

| KR | 10-2016-0087982 | 7/2016 |
| KR | 10-2018-0079092 | 7/2018 |
| KR | 10-2018-0126116 | 11/2018 |

\* cited by examiner

DISPLAY DEVICE HAVING UNDERCUT GROOVE FILLED WITH ENCAPSULATION LAYER

CROSS-REFERENCE TO RELATED APPLICATION

This application claims priority under 35 U.S.C. § 119 from, and the benefit of, Korean Patent Application No. 10-2019-0042670, filed on Apr. 11, 2019 in the Korean Intellectual Property Office, the contents of which are herein incorporated by reference in their entirety.

BACKGROUND

1. Technical Field

One or more embodiments are directed to a display device.

2. Discussion of the Related Art

A display device is an apparatus that displays an image. Types of display devices include a liquid crystal display, an electrophoretic display, an organic light-emitting display, a field emission display, a surface-conduction electron-emitter display, a plasma display, or a cathode ray display.

A display device includes a display area that displays an image and a peripheral area around the display area in which wirings, etc., that transmit signals to the display area are arranged. Recently, to implement a lightweight and slim profile display device that can maintain a high quality image, research is being conducted into encapsulating a display area and a peripheral area by using an organic layer.

SUMMARY

Embodiments of the disclosure can provide a thin-film encapsulation (TFE) layer that encapsulates a display device and has a structure in which an inorganic encapsulation layer and an organic encapsulation layer are alternately stacked.

One or more embodiments include a display device that includes an optimized thin-film encapsulation layer.

According to one or more embodiments, a display device includes: a substrate that includes a display area that displays an image and a peripheral area outside the display area; a display element disposed in the display area and that includes a pixel electrode, an emission layer, and an opposite electrode, where the pixel electrode is connected to a thin film transistor; a thin-film encapsulation layer that covers the display element and includes a first inorganic encapsulation layer, an organic encapsulation layer, and a second inorganic encapsulation layer that are sequentially stacked; and at least one groove formed in the peripheral area, where at least a portion of the thin-film encapsulation layer fills the at least one groove, where the at least one groove is concave into a multi-layer structure that includes a first layer and a second layer disposed on the first layer, and the at least one groove has an undercut structure in which the second layer protrudes toward a center of the at least one groove.

A portion of the organic encapsulation layer may fill the inside of the at least one groove, and the first inorganic encapsulation layer and the second inorganic encapsulation layer may contact each other inside the at least one groove.

The display device may further include: a planarization layer that covers the at least one groove and includes an organic insulating material, wherein at least a portion of the planarization layer may overlap the organic encapsulation layer.

The display device may further include: a barrier layer disposed on the planarization layer and that includes an inorganic material.

The at least one groove may include a first groove and a second groove, where the second groove is farther away from the display area than the first groove, the first groove may be filled with the organic encapsulation layer, and the second groove may be filled with a portion of the organic encapsulation layer.

The display device may further include: a via layer disposed between the thin film transistor and the display element; and a pixel-defining layer that covers edges of the pixel electrode, where the first layer may include the same material as the via layer, and the second layer may include the same material as the pixel-defining layer.

The display device may further include: a top conductive layer interposed between the first layer and the second layer, where the top conductive layer includes the same material as the pixel electrode.

The via layer may include a top via layer and a bottom via layer, and the first layer may include the same material as the bottom via layer. The display device may further include an intermediate layer interposed between the first layer and the top conductive layer, where the intermediate layer includes the same material as that of the top via layer, and a bottom conductive layer disposed under the first layer, where a bottom surface of the at least one groove may is a top surface of the bottom conductive layer.

The via layer may include a top via layer and a bottom via layer, and the first layer may include the same material as the bottom via layer. The display device may further include an intermediate conductive layer interposed between the first layer and the top conductive layer, where the intermediate conductive layer includes a conductive material.

The display device may further include: an intermediate conductive layer disposed under the first layer, where a bottom surface of the at least one groove is a top surface of the intermediate conductive layer.

According to one or more embodiments, a display device includes: a substrate that includes a display area that displays an image and a peripheral area outside the display area; a display element disposed in the display area and that includes a pixel electrode, an emission layer, and an opposite electrode, where the pixel electrode is connected to a thin film transistor; a thin-film encapsulation layer that covers the display element and includes a first inorganic encapsulation layer, an organic encapsulation layer, and a second inorganic encapsulation layer that are sequentially stacked; and a dam unit formed in the peripheral area and that includes a first dam and a second dam spaced apart from each other, wherein at least one of the first dam and the second dam has an undercut structure.

A portion of the organic encapsulation layer may fill a separation space between the first dam and the second dam, and the first inorganic encapsulation layer and the second inorganic encapsulation layer may contact each other in the separation space.

The display device may further include: a planarization layer that covers the dam unit and includes an organic insulating material, where at least a portion of the planarization layer may overlap the organic encapsulation layer.

The display device may further include: a barrier layer disposed on the planarization layer and that includes an inorganic material.

The dam unit may further include: a third dam located farther away from the display area than the first dam and the second dam, where the organic encapsulation layer may fill a separation space between the first dam and the second dam, and a portion of the organic encapsulation layer may fill a separation space between the second dam and the third dam.

The display device may further include: a via layer interposed between the thin film transistor and the display element; and a pixel-defining layer that covers edges of the pixel electrode, where each of the first dam and the second dam may include a first layer and a second layer disposed on the first layer, the first layer includes the same material as the via layer, and the second layer includes the same material as the pixel-defining layer.

The display device may further include: a top conductive layer interposed between the first layer and the second layer, where the top conductive layer includes the same material as the pixel electrode.

The via layer may include a top via layer and a bottom via layer, where the first layer may include the same material as the bottom via layer. The display device may further include an intermediate layer interposed between the first layer and the top conductive layer, where the intermediate layer includes the same material as the top via layer.

The via layer may include a top via layer and a bottom via layer, where the first layer may include the same material as the bottom via layer. The display device may further include an intermediate conductive layer disposed between the first layer and the top conductive layer, where the intermediate conductive layer includes a conductive material.

According to one or more embodiments, a display device includes: a substrate that includes a display area that displays an image and a peripheral area outside the display area; a display element disposed in the display area and that includes a pixel electrode, an emission layer, and an opposite electrode, wherein the pixel electrode is connected to a thin film transistor; a thin-film encapsulation layer that covers the display element and includes a first inorganic encapsulation layer, an organic encapsulation layer, and a second inorganic encapsulation layer that are sequentially stacked; a dam unit formed in the peripheral area and that includes a first dam and a second dam spaced apart from each other; and at least one groove formed in the peripheral area between the first dam and the second dam, wherein at least a portion of the thin-film encapsulation layer fills the at least one groove, and the at least one groove has an undercut structure.

These and other aspects will become apparent and more readily appreciated from the following description of the embodiments, taken in conjunction with the accompanying drawings.

DETAILED DESCRIPTION

Figure 1:
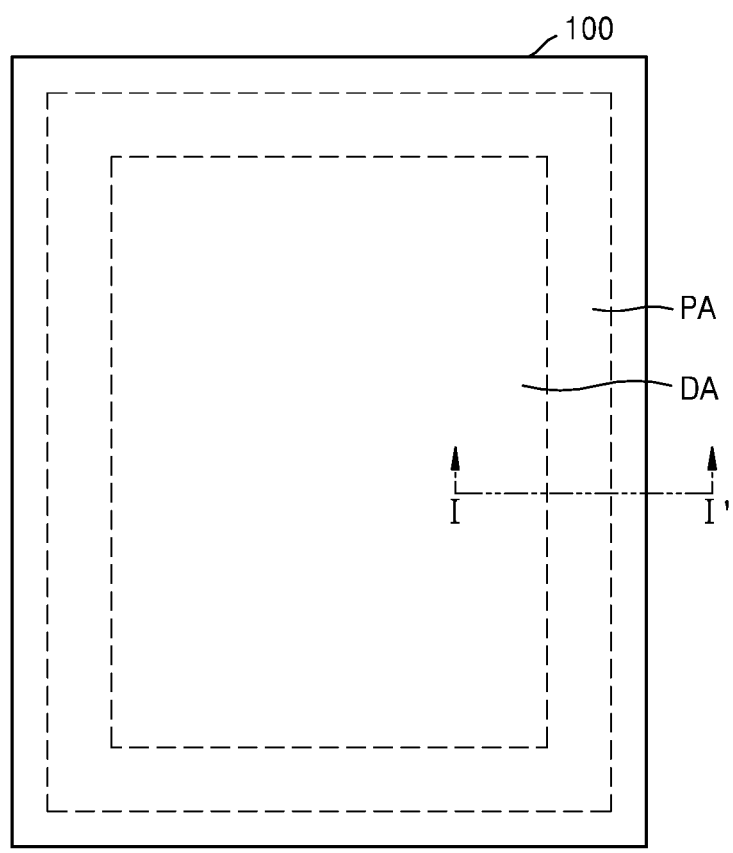
FIG. 1 is a plan view of a display device according to an embodiment.

Reference will now be made in detail to embodiments, examples of which are illustrated in the accompanying drawings, wherein like reference numerals may refer to like elements throughout. In this regard, the present embodiments may have different forms and should not be construed as being limited to the descriptions set forth herein.

Hereinafter, exemplary embodiments according to the present disclosure are described in detail with reference to the drawings. With reference to the drawings, same reference numerals may be used for substantially the same or corresponding elements and repeated description thereof is omitted.

It will be understood that when a layer, region, or component is referred to as being "formed on" another layer, region, or component, it can be directly or indirectly formed on the other layer, region, or component.

Sizes of elements in the drawings may be exaggerated for convenience of explanation.

A display device according to an embodiment will be described with reference to an organic light-emitting display device as an example, however, a display device according to embodiments of the present disclosure are not limited thereto and a display device according to other embodiments may be any one of the aforementioned types.

FIG. 1 is a plan view of a portion of a display device according to an embodiment. As shown in FIG. 1, a display device according to a present embodiment includes a substrate 100. The substrate 100 includes a display area DA and a peripheral area PA outside the display area DA.

According to an embodiment, a plurality of pixels that display an image are disposed in the display area DA of the substrate 100. Various display elements such as an organic light-emitting diode OLED, a thin film transistor, a capacitor, etc., are disposed in the display area DA. A pixel that displays an image is formed by electric connections of the display element, the thin film transistor, the capacitor, etc. A driving current flows through the display element, depending on a gate signal, a data signal, a driving voltage ELVDD, a common voltage ELVSS, etc. The display element emits light at a brightness that corresponds to the driving current.

According to an embodiment, the peripheral area PA is disposed outside the display area DA. Wirings that transmit various signals or power to the display area DA are disposed in the peripheral area PA. In addition to the wirings, thin film transistors that control electric signals transmitted to the display area DA are further disposed in the peripheral area PA. In addition, a dam or groove, etc., that blocks the flow of an organic material used in manufacturing a display device is disposed in the peripheral area PA.

Figure 2A:
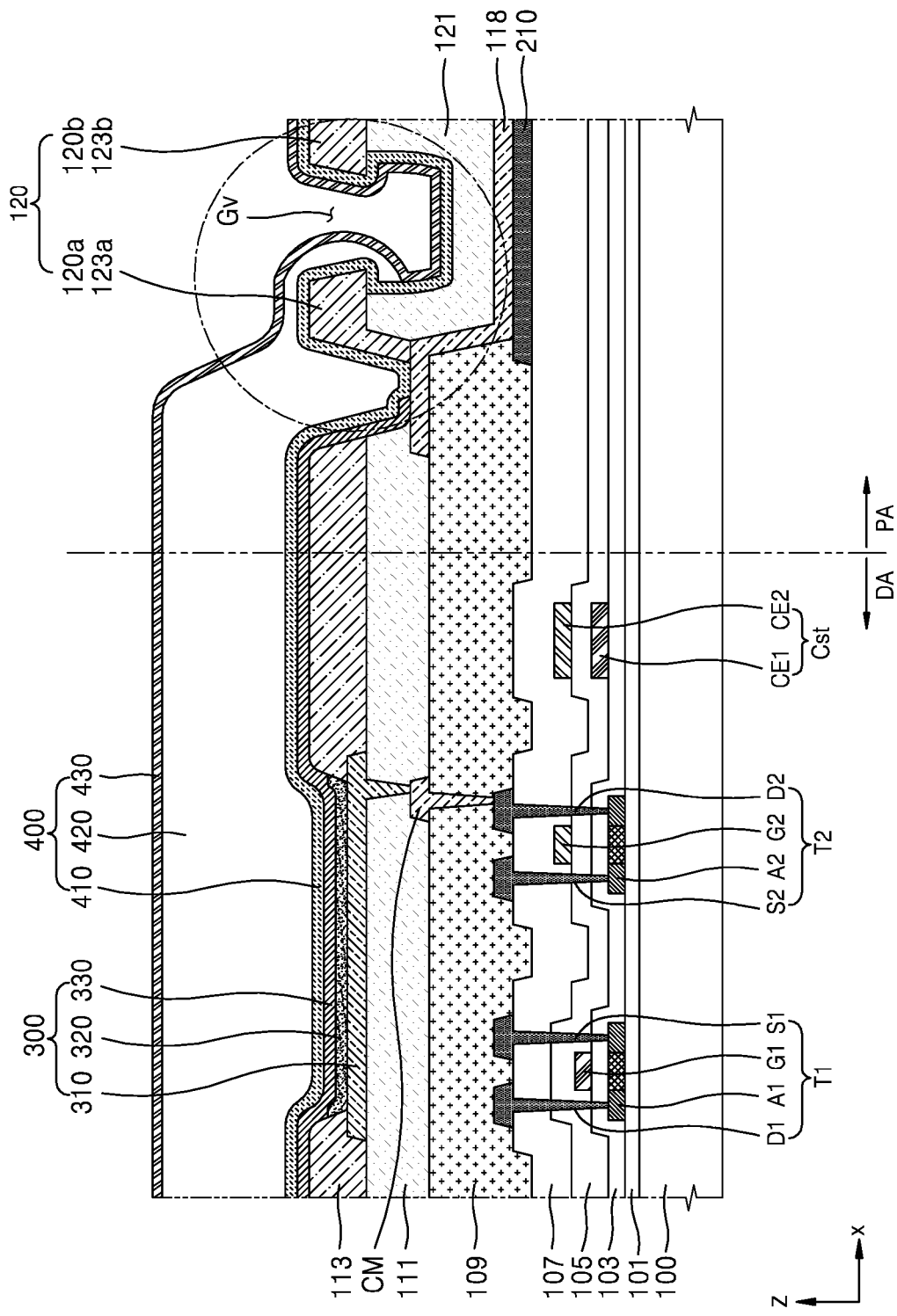
FIG. 2A is a cross-sectional view of a display device taken along line of FIG. 1.
Figure 2B:
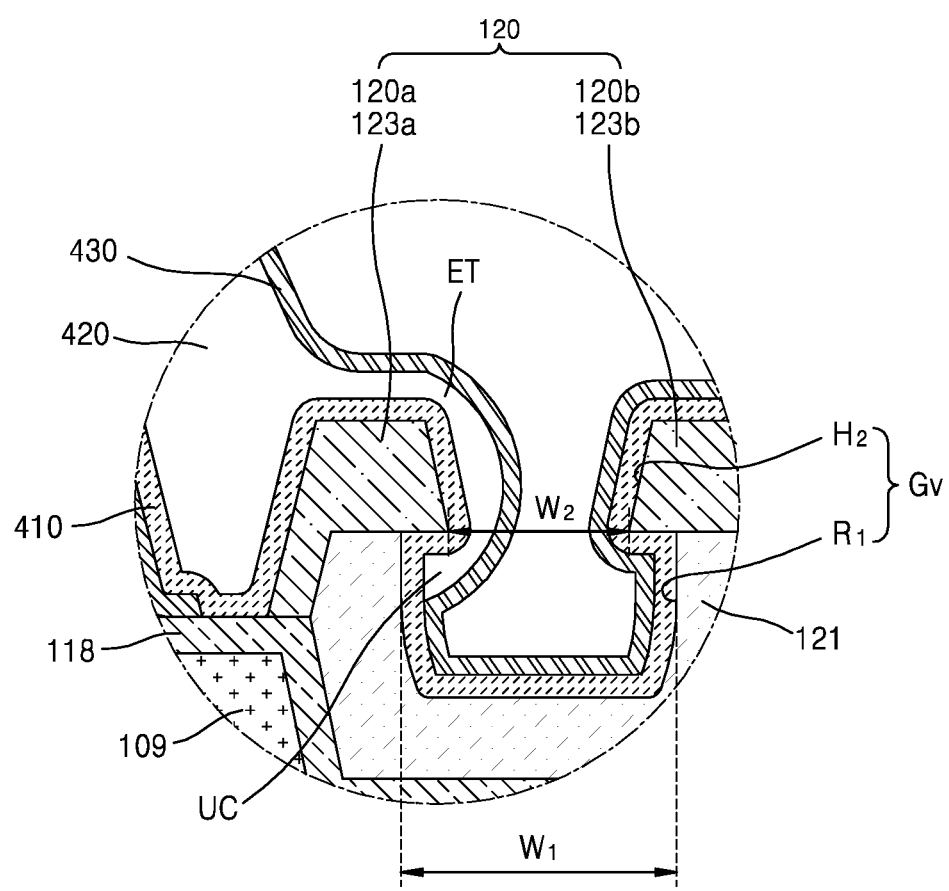
FIG. 2B is an enlarged cross-section of a groove Gv of a display device according to an embodiment.

FIG. 2A is a cross-sectional view of a display device taken along line I-I' of FIG. 1, and FIG. 2B is an enlarged cross-sectional view of a region of a display device according to an embodiment that includes a groove Gv.

Referring to FIG. 2A, according to an embodiment, a display device according to an embodiment includes the substrate 100 and a thin-film encapsulation layer 400, the substrate 100 includes the display area DA and the peripheral area PA, and the thin-film encapsulation layer 400 seals the display area DA and the peripheral area PA.

According to an embodiment, the substrate 100 includes various materials. For example, the substrate 100 includes a transparent glass material that includes $SiO_2$ as a main component. However, embodiments are not limited thereto, and the substrate 100 may include a transparent plastic material. The plastic material includes an insulating organic material such as polyethersulfone (PES), polyarylate (PAR), polyacrylate, polyetherimide (PEI), polyethylene naphthalate (PEN), polyethylene terephthalate (PET), polyphenylene sulfide (PPS), polyimide, polycarbonate (PC), tri-acetate cellulose (TAC), or cellulose acetate propionate (CAP).

According to an embodiment, a buffer layer 101 is disposed on the substrate 100 and can reduce or block penetration of foreign substances, moisture, or external air from below the substrate 100, and provide a flat surface on the substrate 100. The buffer layer 101 may include an inorganic material such as an oxide or a nitride, an organic material, or an organic/inorganic composite material. The buffer layer 101 may have a single-layered or multi-layered structure.

According to an embodiment, a first thin film transistor T1 is disposed on the substrate and includes a first semiconductor layer A1, a first gate electrode G1, a first source electrode S1, and a first drain electrode D1. A second thin film transistor T2 is disposed on the substrate and includes a second semiconductor layer A2, a second gate electrode G2, a second source electrode S2, and a second drain electrode D2.

FIG. 2A illustrates a case where the thin film transistors, that is, the first and second thin film transistors T1 and T2, are top-gate type thin film transistors. However, embodiments are not limited thereto, and other types of thin film transistors, such as a bottom-gate type thin film transistor, are used in other embodiments.

In addition, according to an embodiment, although FIG. 2A illustrates a case in which there are two thin film transistors, that is, the first and second thin film transistors T1 and T2, embodiments are not limited thereto. In other embodiments, a display device may use two or more thin film transistors, such as the first and second thin film transistors T1 and T2, for one pixel. In an embodiment, six to seven thin film transistors are used for one pixel and various modifications thereof can be made.

According to an embodiment, the semiconductor layers A1 and A2 include amorphous silicon or polycrystalline silicon. In another embodiment, the semiconductor layers A1 and A2 include an oxide of at least one of In, Ga, Sn, Zr, V, Hf, Cd, Ge, Cr, Ti, or Zn. The semiconductor layers A1 and A2 include a channel region, a source region, and a drain region, the source region and the drain region have a greater carrier concentration than that of the rest of the channel region.

According to an embodiment, the first gate electrode G1 is disposed over the semiconductor layer A1 with a first gate insulating layer 103 interposed therebetween. The first gate electrode G1 includes at least one of Mo, Al, Cu, or Ti, and may include a single layer or a multi-layer. For example, the first gate electrode G1 includes a single Mo layer.

According to an embodiment, the first gate insulating layer 103 insulates the semiconductor layer A1 from the first gate electrode G1 and includes one of $SiO_2$, $SiN_x$, SiON, $Al_2O_3$, $TiO_2$, $Ta_2O_5$, $HfO_2$, or $ZnO_2$.

As described above, according to an embodiment, the first gate electrode G1 of the first thin film transistor T1 and the second gate electrode G2 of the second thin film transistor T2 are disposed on different layers. Therefore, driving ranges of the first thin film transistor T1 and the second thin film transistor T2 can be adjusted separately from each other.

According to an embodiment, a first electrode CE1 of a storage capacitor Cst is disposed on the same layer as the first gate electrode G1, and includes the same material as the first gate electrode G1. A second electrode CE2 of the storage capacitor Cst overlaps the first electrode CE1 with a second gate insulating layer 105 interposed therebetween. The second electrode CE2 is disposed on the same layer as the second gate electrode G2 and includes the same material as the second gate electrode G2.

According to an embodiment, FIG. 2A shows that the storage capacitor Cst does not overlap the first thin film transistor T1 or the second thin film transistor T2. However, embodiments are not limited thereto. For example, the storage capacitor Cst may overlap the first thin film transistor T1. In an embodiment, the first electrode CE1 of the storage capacitor Cst may be integrally formed with the first gate electrode G1. That is, the first gate electrode G1 of the first thin film transistor T1 can function as the first electrode CE1 of the storage capacitor Cst.

According to an embodiment, an interlayer insulating layer 107 covers the second electrode CE2. The interlayer insulating layer 107 includes one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

According to an embodiment, the first and second source electrodes S1 and S2 and the first and second drain electrodes D1 and D2 are disposed on the interlayer insulating layer 107. The source electrodes S and the drain electrodes D include a conductive material, such as Mo, Al, Cu or Ti, and may has a single layered or a multi-layered structure that includes at least some of the above materials. For example, the first and second source electrodes S1 and S2 and the first and second drain electrodes D1 and D2 each have a multi-layered structure of Ti/Al/Ti.

According to an embodiment, a bottom via layer 109 and a top via layer 111 are disposed on the first and second source electrodes S1 and S2 and the first and second drain electrodes D1 and D2. A display element 300 is disposed on the top via layer 111. The bottom via layer 109 and the top via layer 111 may have a single layered or a multi-layered structure that includes an organic material. The organic material may be a general-purpose polymer such as polymethylmethacrylate (PMMA) or polystyrene (PS), polymer derivatives that have a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In addition, each of the bottom via layer 109 and the top via layer 111 may include a composite stacked body that includes an inorganic insulating layer and an organic insulating layer.

According to an embodiment, a connection metal CM is disposed between the bottom via layer 109 and the top via layer 111. The connection metal CM is electrically connected to the second thin film transistor T2 by contacting one of the second source electrode S2 or the second drain electrode D2 of the second thin film transistor T2 through an opening formed in the bottom via layer 109.

According to an embodiment, a wiring is further provided on the bottom via layer 109 that is spaced apart from the connection metal CM and that includes the same material as that of the connection metal CM.

According to an embodiment, although FIG. 2A shows that the bottom via layer 109 and the top via layer 111 are disposed between the first and second thin film transistors T1 and 12, and the display element 300, embodiments are not limited thereto. For example, in some embodiments, only one of the bottom via layer 109 or the top via layer 111 may be disposed between the first and second thin film transistors T1 and T2, and the display element 300. Various modifications may be made in other embodiments.

According to an embodiment, the display element 300 is disposed on the top via layer 111 in the display area DA of the substrate 100 and includes a pixel electrode 310, an opposite electrode 330, and an emission layer 320, where the emission layer is interposed between the pixel electrode 310 and the opposite electrode 330 and includes an emission area. The pixel electrode 310 is electrically connected to the second thin film transistor T2 by the connection metal CM through an opening formed in the top via layer 111.

According to an embodiment, the pixel electrode 310 may include a reflective electrode. For example, the pixel electrode 310 may include a reflective layer and a transparent or semi-transparent electrode layer on the reflective layer, where the reflective layer includes at least one of Ag, Mg, Al, Pt, Pd, Au, Ni, Nd, Ir, Cr, or a compound thereof. The transparent or semi-transparent electrode layer includes at least one of indium tin oxide (ITO), zinc oxide (IZO), zinc oxide (ZnO), indium oxide ($In_2O_3$), indium gallium oxide (IGO), or aluminum zinc oxide (AZO).

According to an embodiment, a pixel-defining layer 113 is disposed on the top via layer 111. The pixel-defining layer 113 includes an opening that corresponds to each pixel, that is, an opening that exposes at least a central portion of the pixel electrode 310. In addition, the pixel-defining layer 113 can prevent an arc, etc., from occurring at the edges of the pixel electrode 310 by increasing a distance between the edge of the pixel electrode 310 and the opposite electrode 330 over the pixel electrode 310. The pixel-defining layer 113 includes an organic material such as polyimide or hexamethyldisiloxane (HMDSO).

According to an embodiment, the emission layer 320 of the display element 300 includes a low molecular weight or polymer material. When the emission layer 320 includes a low molecular weight material, the emission layer 320 has a structure in which a hole injection layer (HIL), a hole transport layer (HTL), an emission layer (EML), an electron transport layer (ETL), an electron injection layer (EIL), etc., are stacked in a single or a composite configuration. The emission layer 320 includes various organic materials, such as copper phthalocyanine (CuPc), N,N'-Di(naphthalene-1-yl)-N,N'-diphenyl-benzidine (NPB), or tris-8-hydroxyquinoline aluminum (Alq3). These layers can be formed by vacuum deposition.

According to an embodiment, when the emission layer 320 includes a polymer material, the emission layer 320 has a structure that generally includes an HTL and an EML. In this case, the HTL includes PEDOT, and the EML includes a polymer material such as a polyphenylene vinylene (PPV)-based material or a polyfluorene-based material. The emission layer 320 can be formed by screen printing, inkjet printing, a laser induced thermal imaging (LITI), etc.

However, embodiments of the emission layer 320 are not limited thereto and can have various other structures in other embodiments. In addition, the emission layer 320 includes a layer which is integrally formed over the plurality of pixel electrodes 310, or includes a patterned layer that corresponds to each of the plurality of pixel electrodes 310.

According to an embodiment, the opposite electrode 330 is disposed in the display area DA. As shown in FIG. 2A, the opposite electrode 330 covers the display area DA. That is, the opposite electrode 330 is integrally formed over a plurality of display elements and corresponds to a plurality of pixel electrodes 310.

According to an embodiment, the opposite electrode 330 includes a light transmissive electrode. For example, the opposite electrode 330 is a transparent or semi-transparent electrode and includes a thin metal layer that has a small work function and includes at least one of Li, Ca, LiF/Ca, LiF/Al, Al, Ag, Mg, or a compound thereof.

According to an embodiment, since the pixel electrode 310 is a reflective electrode, and the opposite electrode 330 is a light transmissive electrode, a display device according to an embodiment is a top-emission type display device in which light is emitted from emission layer 320 to the opposite electrode 330. However, embodiments are not limited thereto and, a display device according to an embodiment may be a bottom-emission type display device in which light is emitted from the emission layer 320 to the substrate 100. In this case, the pixel electrode 310 is a transparent or semi-transparent electrode, and the opposite electrode 330 is a reflective electrode. In addition, a display device according to a present embodiment can be a dual emission-type display device which emits light in two directions, toward both a top side and a bottom side.

According to an embodiment, a thin-film encapsulation layer 400 can prevent the penetration of external moisture and oxygen by covering the display area DA and the peripheral area PA. The thin-film encapsulation layer 400 includes at least one organic encapsulation layer and at least one inorganic encapsulation layer. Although FIG. 2A shows that the thin-film encapsulation layer 400 includes two inorganic encapsulation layers, that is, a first inorganic encapsulation layer 410 and a second inorganic encapsulation layer 430, and one organic encapsulation layer 420, a stacking sequence and the number of layers are not limited to those of an embodiment shown in FIG. 2A.

According to an embodiment, the first inorganic encapsulation layer 410 covers the opposite electrode 330 and includes one or more of silicon oxide, silicon nitride or silicon oxynitride. When needed, other layers, such as a capping layer, can be interposed between the first inorganic encapsulation layer 410 and the opposite electrode 330. Since the first inorganic encapsulation layer 410 is formed along a structure thereunder, a top surface thereof is not flat, as shown in FIG. 2A. The organic encapsulation layer 420 covers the first inorganic encapsulation layer 410. Unlike the first inorganic encapsulation layer 410, a top surface of the organic encapsulation layer 420 is substantially flat. Specifically, a top surface of a portion of the organic encapsulation layer 420 that corresponds to the display area DA is flat. The organic encapsulation layer 420 includes at least one of polyethylene terephthalate, polyethylene naphthalate, polycarbonate, polyimide, polyethylene sulfonate, polyoxymethylene, polyarylate, or hexamethyldisiloxane. The second inorganic encapsulation layer 430 covers the organic encapsulation layer 420 and includes at least one of silicon oxide, silicon nitride, or silicon oxynitride.

According to an embodiment, because the thin-film encapsulation layer 400 includes the first inorganic encapsulation layer 410, the organic encapsulation layer 420, and the second inorganic encapsulation layer 430 as described above, even when a crack occurs inside the thin-film encapsulation layer 400, the thin-film encapsulation layer 400 can prevent cracks from connecting to each other through such a multi-layered structure, since the cracks occur between the first inorganic encapsulation layer 410 and the organic encapsulation layer 420 or between the organic encapsulation layer 420 and the second inorganic encapsulation layer 430. Due to this structure, paths through which external moisture or oxygen can penetrate into the display area DA and the peripheral area PA can be prevented or minimized. The second inorganic encapsulation layer 430 contacts the first inorganic encapsulation layer 410 at an edge thereof located outside the display area DA, thereby preventing the organic encapsulation layer 420 from being externally exposed.

In a present embodiment, a groove Gv is formed in the peripheral area PA of the substrate 100. The groove Gv is formed through multiple layers of a dam 120 and has an undercut structure. In this regard, FIG. 2A shows a multi-layer dam 120 that includes a first layer 121, and second layers 123a and 123b on the first layer 121. In addition, the second layers 123a and 123b protrude toward the center of the groove Gv to constitute an undercut structure.

According to an embodiment, groove Gv is formed in a depth direction of the multi-layer dam 120. As shown in FIG. 2B, a second hole H2 that penetrates the second layers 123a and 123b is formed by etching the second layers 123a and 123b, and a first recess R1 that is concave in a thickness direction into the first layer 121 is formed by etching the first layer 121. The first recess R1 and the second hole H2 are spatially connected to each other to constitute the groove Gv. The above-described etching may include isotropic etching or anisotropic etching.

According to an embodiment, a width of a portion of the groove Gv that penetrates the second layers 123a and 123b is less than a width of a portion of the groove Gv that penetrates into the first layer 121. For example, a width W2 of the second hole H2 is less than a width W1 of the first recess R1.

According to an embodiment, the first layer 121 and the second layers 123a and 123b include an organic insulating material. For example, the first layer 121 and the second layers 123a and 123b include a polymer resin such as polyimide. In an embodiment, the first layer 121 is simultaneously formed with the top via layer 111 by using the same material as the top via layer 111, and the second layers 123a and 123b are simultaneously formed with the pixel-defining layer 113 by using the same material as the pixel-defining layer 113.

According to an embodiment, the undercut structure can prevent an edge tail from being formed long when the organic encapsulation layer 420 of the thin-film encapsulation layer 400 is formed.

According to an embodiment, to form the organic encapsulation layer 420, a process of coating and hardening a liquid organic material is performed. In this case, the liquid organic material flows to an edge of the substrate 100 due to the fluidity of the liquid organic material.

A present embodiment with the undercut structure UC can prevent the liquid organic material from flowing to an edge of the substrate 100 by providing the groove Gv with the undercut structure UC in the peripheral area PA of the substrate 100.

Figure 2C:
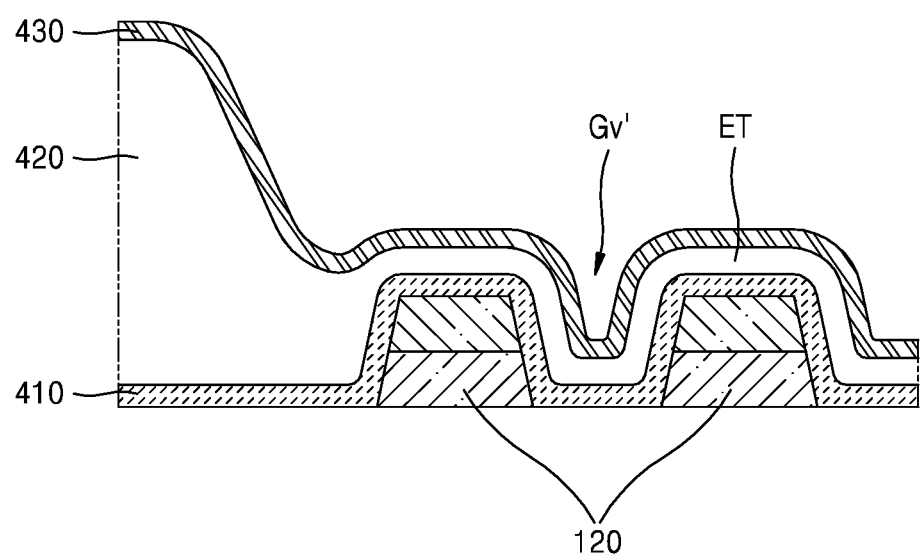
FIG. 2C is a comparative example that illustrates an edge tail.

When a groove Gv' does not include an undercut structure as shown in FIG. 2C, a portion of the liquid organic material can flow outward from the groove Gv' along an inner lateral surface of the groove Gv'.

That is, although the organic encapsulation layer 420 does not fully fill the groove Gv' and does not flood the groove Gv', an edge tail ET of the organic material can form due to the fluidity thereof and thus the organic material may be present in the peripheral area PA.

In contrast, since embodiments of the disclosure include the undercut structure UC in the groove Gv, the liquid organic material collects in the undercut structure UC by a capillary phenomenon in which a liquid flows into a narrow region. Therefore, the liquid organic material can be prevented from flowing over the groove Gv along the inner lateral surface of the groove Gv. That is, the groove Gv with a concave undercut cross-section can minimize an edge tail ET of the organic material of the organic encapsulation layer 420.

According to an embodiment, while a portion of the organic encapsulation layer 420 fills the inside of the groove Gv, the first inorganic encapsulation layer 410 and the second inorganic encapsulation layer 420 contact each other inside the groove Gv. As described above, the organic encapsulation layer 420 is not externally exposed.

In addition, according to an embodiment, the groove Gv is formed by a first dam 120a and a second dam 120b that are spaced apart from each other.

According to an embodiment, at least one of the first dam 120a and the second dam 120b has an undercut structure. Therefore, a portion of the organic encapsulation layer 420 fills a separation space between the first dam 120a and the second dam 120b. Since at least one of the first dam 120a and the second dam 120b has an undercut structure, the liquid organic material collects in the undercut structure by a capillary phenomenon in which a liquid flows into a narrow region. Therefore, the liquid organic material can be prevented from flowing over the groove Gv along the inner lateral surface of the separation space. Therefore, an edge tail ET of the organic material of the organic encapsulation layer 420 can be minimized.

According to an embodiment, the first inorganic encapsulation layer 410 and the second inorganic encapsulation layer 430 contact each other in the separation space. Therefore, the organic encapsulation layer 420 is not externally exposed.

According to an embodiment, the separation space between the first dam 120a and the second dam 120b has an undercut cross-section that is concave in a thickness direction into the first layer 121. The first layer 121 includes the same material as the top via layer 111, and the second layers 123a and 123b on the first layer 121 include the same material as the pixel-defining layer 113.

According to an embodiment, a bottom conductive layer 210 is disposed in the peripheral area PA of the substrate 100. The bottom conductive layer 210 is a wiring that transmits power to the display area DA. The bottom conductive layer 210 is disposed on the same layer as the first and second source electrodes S1 and S2 and the first and second drain electrodes D1 and D2 and includes the same material as the first and second source electrodes S1 and S2 and first and second the drain electrodes D1 and D2.

According to an embodiment, an intermediate conductive layer 118 is disposed on the bottom conductive layer 210. The intermediate conductive layer 118 is connected to the opposite electrode 330 of the display element 300 and is a wiring that transmits a common voltage ELVSS. The intermediate conductive layer 118 includes the same material as the connection metal CM.

As described above, according to an embodiment, the top via layer 111 and the pixel-defining layer 113 include an organic material. The organic material adheres more strongly with metal than with an inorganic material of the interlayer insulating layer 107. Therefore, since the first layer 121 contacts the intermediate conductive layer 118, the first layer 121 and the second layers 123a and 123b can be stably formed with excellent adhesion. However, embodiments are not limited thereto. In other embodiment, the intermediate conductive layer 118 can be omitted, and various other modifications may be made.

According to an embodiment, FIG. 2A shows an example in which the bottom conductive layer 210 is connected to the opposite electrode 330 through the intermediate conductive layer 118. However, embodiments are not limited thereto and in other embodiments, the bottom conductive layer 210 can be directly connected to the opposite electrode 330. Various modifications may be made.

Figure 3:
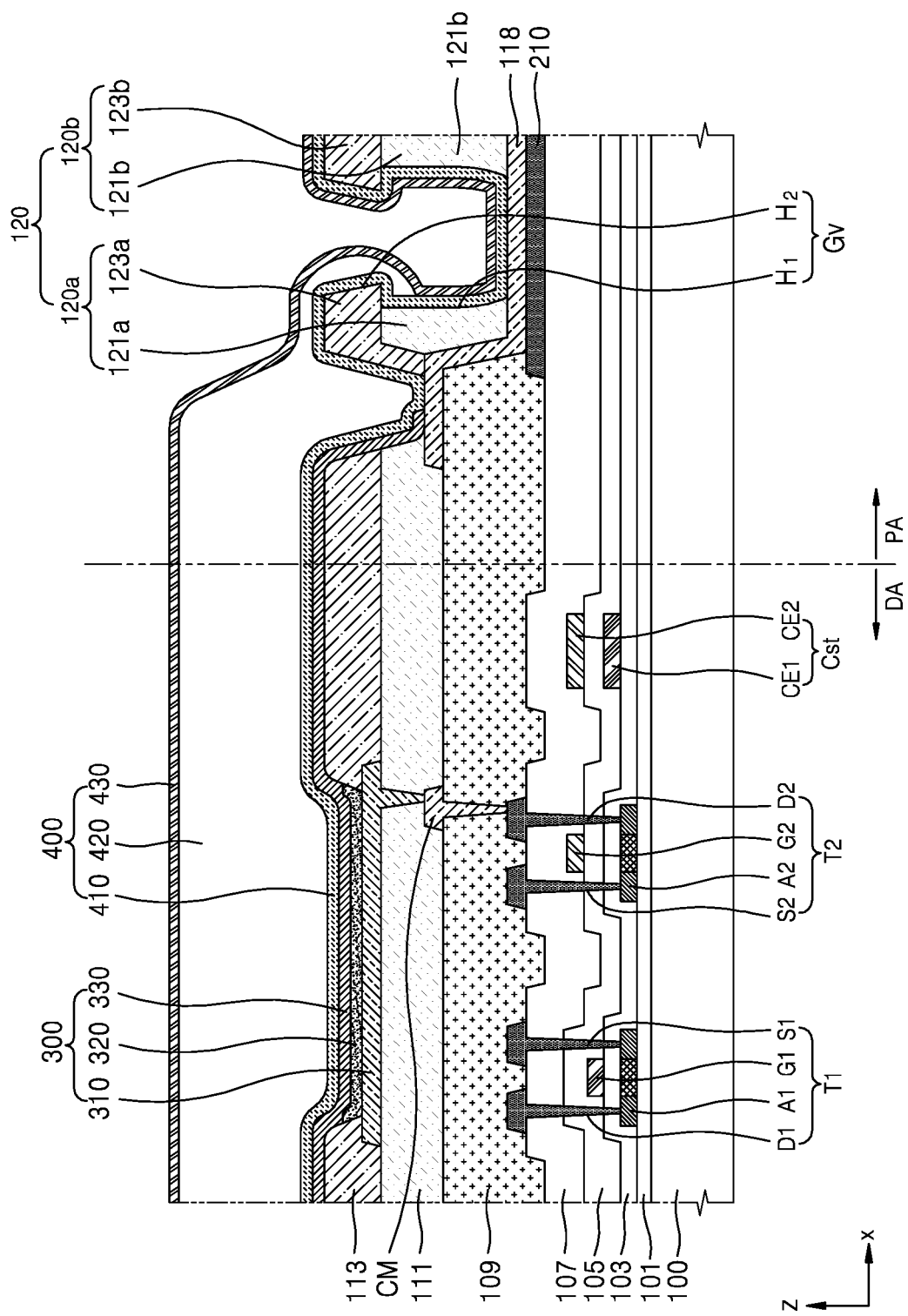
FIG. 3 is a cross-sectional view of a display device according to another embodiment.

FIG. 3 is a cross-sectional view of a display device according to another embodiment. In FIG. 3, same reference numerals as those of FIG. 2A represent the same members and a repeated description of the same members is omitted.

Referring to FIG. 3, a display device according to an embodiment includes the display element 300 disposed in the display area DA of the substrate 100, the thin-film encapsulation layer 400 that covers the display element 300, and the groove Gv with an undercut structure formed in the peripheral area PA of the substrate 100.

According to an embodiment, the groove Gv is formed in a depth direction of a multi-layer dam 120'. As shown in FIG. 3, the second hole H2 penetrates the second layers 123a and 123b and is formed by etching the second layers 123a and 123b, and a first hole H1 that penetrates the first layers 121a and 121b is formed by etching the first layers 121a and 121b.

According to an embodiment, the first hole H1 and the second hole H2 are spatially connected and constitute the groove Gv. The bottom surface of the groove Gv is a top surface of the intermediate conductive layer 118 disposed at the bottom of the groove Gv.

In addition, according to an embodiment, the groove Gv is formed by the first dam 120a and the second dam 120b being spaced apart from each other. The first layer 121a of the first dam 120a and the first layer 121b of the second dam 120b are separated from each and a size of a separation space between the first dam 120a and the second dam 120b is greater than that of a separation space of an embodiment shown in FIG. 2A. Therefore, when the organic material of the organic encapsulation layer 420 floods, the organic material can be more effectively controlled.

Figure 4:
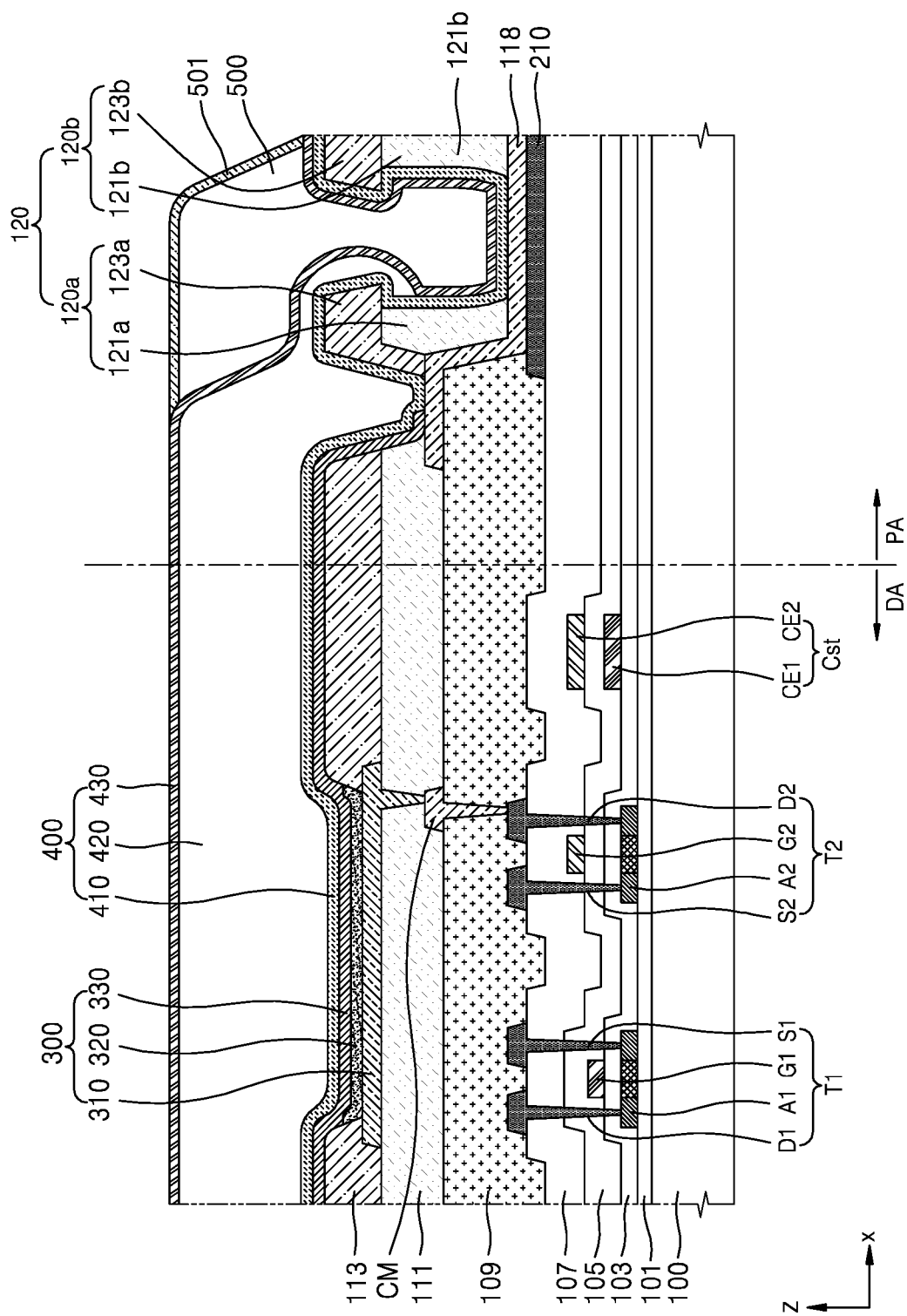
FIG. 4 is a cross-sectional view of a display device according to another embodiment.

FIG. 4 is a cross-sectional view of a display device according to another embodiment. In FIG. 4, the same reference numerals as those of FIG. 3 represent the same members and a repeated description of the same members is omitted.

Referring to FIG. 4, according to an embodiment, a display device according to an embodiment includes the display element 300 disposed in the display area DA of the substrate 100, the thin-film encapsulation layer 400 that covers the display element 300, and the groove Gv with an undercut structure formed in the peripheral area PA of the substrate 100.

In addition, a display device according to a present embodiment includes a planarization layer 500 that covers the groove Gv.

According to an embodiment, the planarization layer 500 includes an organic insulating material. In an embodiment, the planarization layer 500 is formed by coating a photoresist, either a negative or a positive photoresist, or a polymer-based organic material on the thin-film encapsulation layer 400 and patterning the same.

According to an embodiment, the planarization layer 500 alleviates stress that may be applied to the groove Gv and prevents cracks while filling a portion of the groove Gv.

According to an embodiment, a barrier layer 501 is further disposed on the planarization layer 500 and includes an inorganic material. The barrier layer 501 and the planarization layer 500 can prevent or minimize the formation of paths through which external moisture or oxygen penetrates to the peripheral area PA. The barrier layer 501 prevents the planarization layer 500 from being externally exposed by contacts to the second inorganic encapsulation layer 430.

In addition, according to an embodiment, the planarization layer 500 improves a flatness of the display device by covering a region of the peripheral area in which the organic encapsulation layer 420 is not present. Therefore, when an input sensing member or an optical functional member is directly formed on or coupled to the thin-film encapsulation layer 400 using an adhesive layer, the input sensing member and optical functional member, etc., can be prevented from separating or detaching from the display device.

In addition, according to an embodiment, the groove Gv is formed by a dam unit 120 that includes the first dam 120a and the second dam 120b that are spaced apart from each other.

In this case, according to an embodiment, the planarization layer 500 alleviates stress that may be applied to the dam unit 120 and prevents cracks while filling a portion of a separation space between the first dam 120a and the second dam 120b.

According to an embodiment, the barrier layer 501 is disposed on the planarization layer 500 and includes an inorganic material. The barrier layer 501 and the planarization layer 500 prevents or minimizes the formation of paths through which external moisture or oxygen can penetrate to the peripheral area PA.

Figure 5:
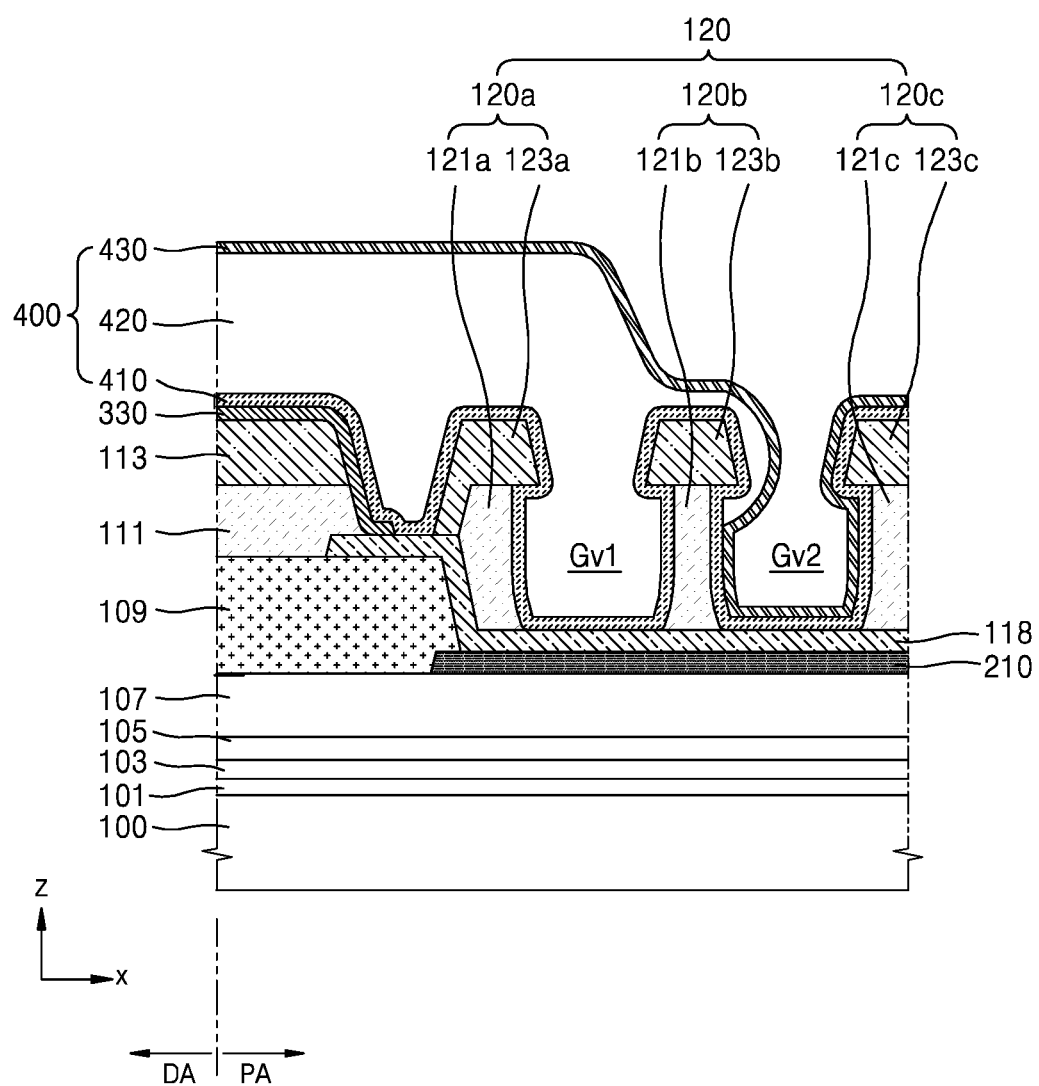
FIG. 5 is a cross-sectional view of a display device according to another embodiment.

FIG. 5 is a cross-sectional view of a display device according to another embodiment. In FIG. 5, same reference numerals as those of FIG. 3 represent the same members and a repeated description of the same members is omitted.

Referring to FIG. 5, a display device according to an embodiment includes the display element (see FIG. 3) disposed in the display area DA of the substrate 100, the thin-film encapsulation layer 400 that covers the display element, and the groove Gv with an undercut structure formed in the peripheral area PA of the substrate 100.

In addition, in a present embodiment, a plurality of grooves Gv are provided. For example, the groove Gv includes a first groove Gv1 close to the display area DA and a second groove Gv2 far away from the display area DA. However, embodiments are not limited thereto. In other embodiments, the display device may further include a third groove, etc., and various other modifications can be made.

According to an embodiment, the first groove Gv1 and the second groove Gv2 are concave in a thickness direction into the first layers 121a, 121b and 121c. The second layers 123a, 123b, and 123c form an undercut structure by extending toward the center of the groove Gv.

According to an embodiment, the first groove Gv1 is filled with the organic encapsulation layer 420. In addition, at least a portion of the second groove Gv2 is filled with the organic encapsulation layer 420. Even though the groove Gv is formed, when the organic material of the organic encapsulation layer 420 floods and fills the first groove Gv1, an edge tail ET of the organic material can be minimized by forming the second groove Gv2. However, embodiments are not limited thereto. In other embodiments, the first groove Gv1 is filled with at least a portion of the the organic encapsulation layer 420, and various other modifications may be made.

According to an embodiment, a planarization layer (see FIG. 4) that includes an organic insulating material is disposed on the second groove Gv2. In addition, a barrier layer that includes an inorganic material (see FIG. 4) is disposed on the planarization layer.

According to an embodiment, the first groove Gv1 is formed by the first dam 120*a* and the second dam 120*b* being spaced apart from each other. In addition, the second groove Gv2 is formed by the second dam 120*b* and a third dam 120*c* being spaced apart from each other.

Referring to FIG. 5, according to an embodiment, the dam unit 120 includes the third dam 120*c* that is spaced farther away from the display area DA than the first dam 120*a* and the second dam 120*b*. In addition, the third dam 120*c* has an undercut structure. Since the dam unit 120 includes a plurality of dams, flooding of the organic material can be more effectively prevented when the organic encapsulation layer 420 is formed. However, embodiments are not limited thereto. In other embodiments, the dam unit 120 may further include a fourth dam, and various other modifications may be made.

According to an embodiment, a separation space between the first dam 120*a* and the second dam 120*b* is filled with the organic encapsulation layer 420. In addition, a portion of the separation space between the second dam 120*b* and the third dam 120*c* is with the organic encapsulation layer 420. When the organic material of the organic encapsulation layer 420 floods and fills the separation space between the first dam 120*a* and the second dam 120*b*, an edge tail ET of the organic material can be minimized by the third dam 120*c*.

Figure 6:
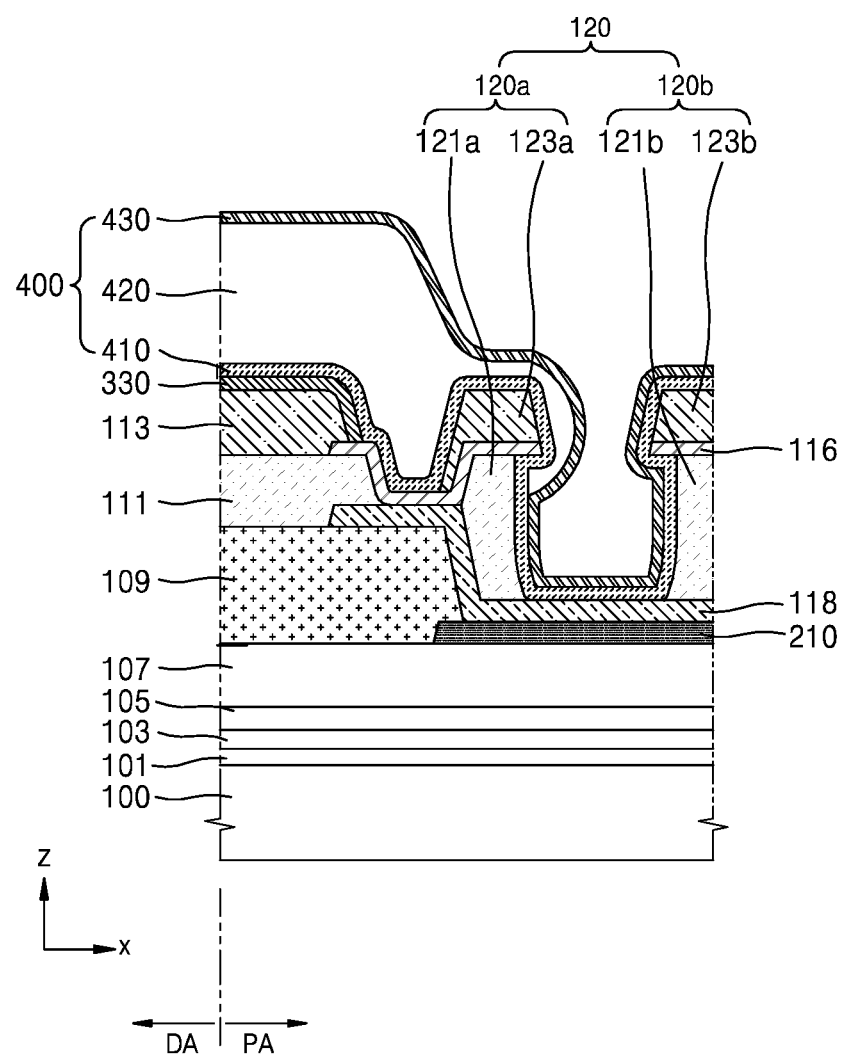
FIG. 6 is a cross-sectional view of a display device according to another embodiment.

FIG. 6 is a cross-sectional view of a display device according to another embodiment. In FIG. 6, same reference numerals represent the same members as those of FIG. 3, and thus a repeated description of the same members is omitted.

Referring to FIG. 6, a display device according to an embodiment includes a display element (See FIG. 3) disposed in the display area DA of the substrate 100, the thin-film encapsulation layer 400 that covers the display element, and the groove Gv with an undercut structure formed in the peripheral area PA of the substrate 100.

In a present embodiment, a top conductive layer 116 that includes the same material as the pixel electrode 310 is interposed between the first layers 121*a* and 121*b* and the second layers 123*a* and 123*b*. As described above, the first layers 121*a* and 121*b* and the second layers 123*a* and 123*b* include an organic material. The organic material adheres more strongly with metal than with the inorganic material that constitutes the interlayer insulating layer 107. Therefore, the first layers 121*a* and 121*b* and the second layers 123*a* and 123*b* can be stably formed with excellent adhesion.

According to an embodiment, the top conductive layer 116 protrudes toward the center of the groove Gv. Referring to FIG. 6, the top conductive layer 116 is adjacent to the first inorganic encapsulation layer 410. However, embodiments are not limited thereto. In other embodiments, a length of the top conductive layer 116 toward the center of the groove Gv may be less than that shown in FIG. 6.

According to an embodiment, the top conductive layer 116 includes a conductive material. To form the groove Gv of a present embodiment, the top conductive layer 116 and the second layers 123*a* and 123*b* are formed by sequentially depositing a first insulating layer, a conductive layer, and a second insulating layer and simultaneously etching the conductive layer and the second insulating layer. Next, the first layers 121*a* and 121*b* are formed by disposing a photoresist on the top conductive layer 116 and the second layers 123*a* and 123*b* and then etching the first insulating layer using the photoresist as a mask. The etching includes dry etching. Therefore, a multi-layer dam 120 is formed that includes the first layers 121*a* and 121*b*, the second layers 123*a* and 123*b* and a groove that is concave in a thickness direction into the first layers 121*a* and 121*b*, and that has the second layers 123*a* and 123*b* protruding toward the center of the groove.

In addition, according to an embodiment, the groove Gv is formed by the first dam 120*a* and the second dam 120*b* being spaced apart from each other.

According to an embodiment, the top conductive layer 116 that includes the same material as the pixel electrode 310 is interposed between the first layers 121*a* and 121*b* of the first and second dams 120*a* and 120*b* and the second layers 123*a* and 123*b* of the first and second dams. As described above, the first layers 121*a* and 121*b* and the second layers 123*a* and 123*b* include an organic material. The organic material adheres more strongly with metal than with the inorganic material that constitutes the interlayer insulating layer 107. Therefore, the first dam 120*a* and the second dam 120*b* can be stably formed with excellent adhesion.

Figure 7:
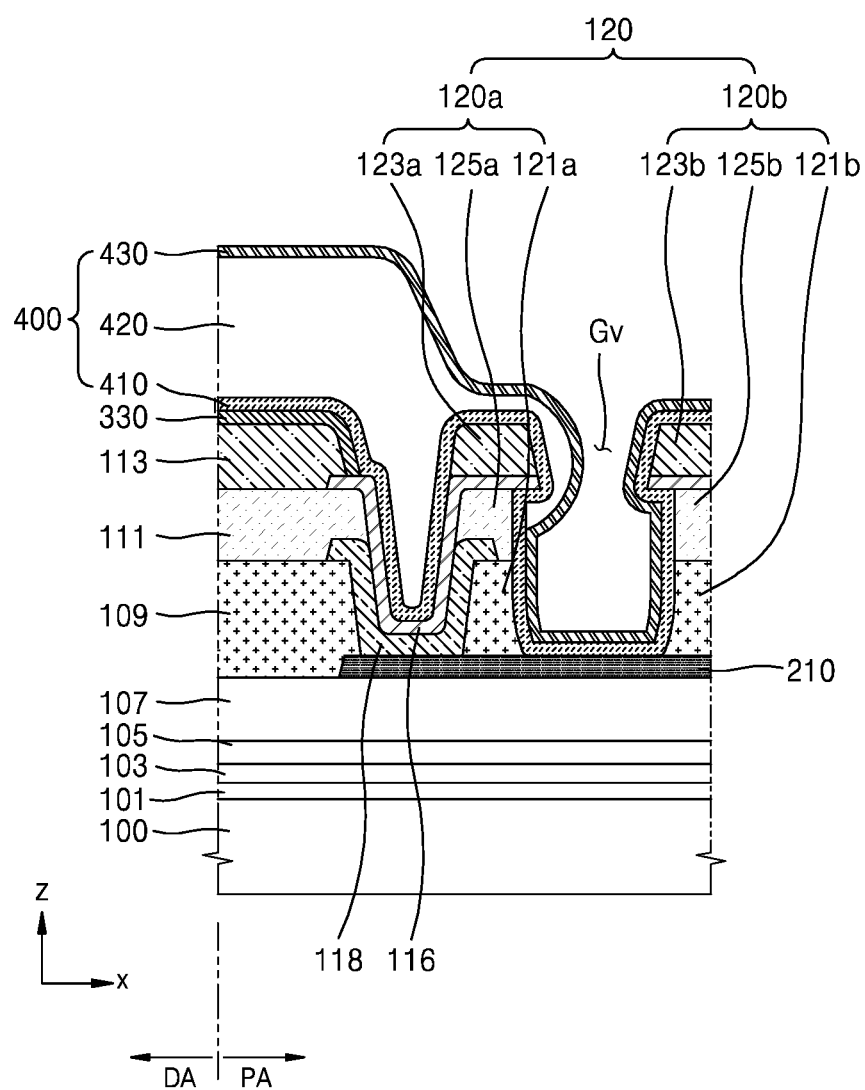
FIG. 7 is a cross-sectional view of a display device according to another embodiment.

FIG. 7 is a cross-sectional view of a display device according to another embodiment. In FIG. 7, same reference numerals represent the same members as those of FIG. 6, and thus a repeated description of the same members is omitted.

Referring to FIG. 7, according to an embodiment, a display device according to an embodiment includes the display element (see FIG. 3) disposed in the display area DA of the substrate 100, the thin-film encapsulation layer 400 that covers the display element, and the groove Gv with an undercut structure formed in the peripheral area PA of the substrate 100.

a present embodiment include the top via layer 111 and the bottom via, layer 109, and the first layers 121*a* and 121*b* include the same material as the bottom via layer 109. In addition, intermediate layers 125*a* and 125*b* that include the same material as the top via layer 111 are interposed between the first layers 121*a* and 121*b* and the top conductive layer 116. Furthermore, the intermediate conductive layer 118 extends up from the bottom conductive layer 210 and between the first layer 121*a* and the intermediate layer 125*a*, but does not extend under the groove Gv. A bottom surface of the groove Gv serves as a top surface of the bottom conductive layer 210.

As described above, according to an embodiment, the top via layer 111 and the bottom via layer 109 each include an organic material and are patterned by dry etching. When the multi-layer includes the first layers 121*a* and 121*b*, the intermediate layers 125*a* and 125*b*, and the second layers 123*a* and 125*b*, a deeper undercut structure can be formed.

Therefore, when an organic material of the organic encapsulation layer floods, the organic material can be more effectively controlled.

According to an embodiment, the groove Gv is formed by the first and second dams 120a and 120b being spaced apart from each other.

According to an embodiment, the first layers 121a and 121b of the first and second dams 120a and 120b include the same material as the bottom via layer 109. In addition, the intermediate layers 125a and 125b include the same material as the top via layer 111 and are interposed between the first layers 121a and 121b and the top conductive layer 116.

As described above, according to an embodiment, the top via layer 111 and the bottom via layer 109 each include an organic material and are patterned by dry etching. When the dam 120 includes the first layers 121a and 121b, the intermediate layers 125a and 125b and the second layers 123a and 123b, a deeper separation space can be formed. Therefore, when an organic material of the organic encapsulation layer floods, the organic material can be more effectively controlled.

Figure 8:
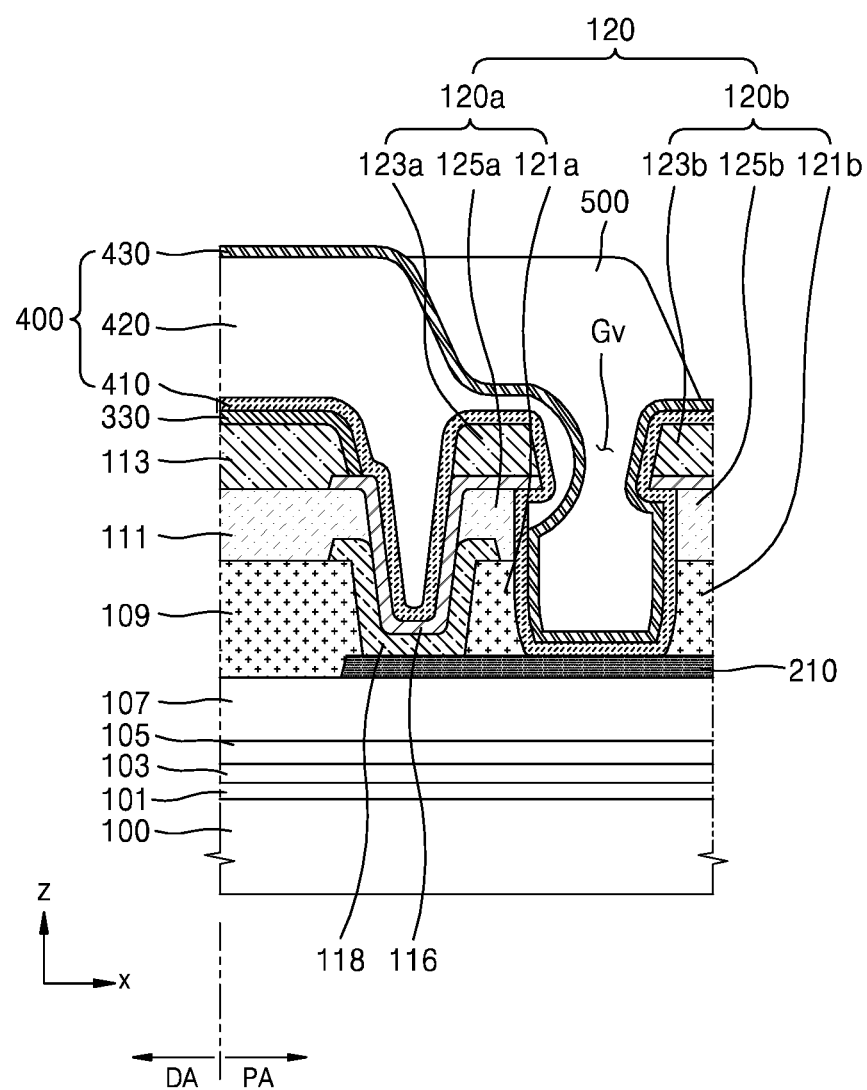
FIG. 8 is a cross-sectional view bf a display device according to another embodiment.

FIG. 8 is a cross-sectional view of a display device according to another embodiment. In FIG. 8, same reference numerals represent the same members as those of FIG. 7, and thus a repeated description of the same members is omitted.

Referring to FIG. 8, a display device according to an embodiment includes a display element (see FIG. 3) disposed in the display area DA of the substrate 100, the thin-film encapsulation layer 400 that covers the display element, and the groove Gv with an undercut structure formed in the peripheral area PA of the substrate 100.

A present embodiment includes the planarization layer 500 that includes an organic insulating material and covers the groove Gv with the concave undercut-shaped cross-section.

In addition, according to an embodiment, a barrier layer that includes an inorganic material is further disposed on the planarization layer 500.

According to an embodiment, the groove Gv is formed by the first dam 20a and the second dam 120b being spaced apart from each other.

In the undercut structure shape of FIG. 8, according to an embodiment, the planarization layer 500 includes an organic insulating material and covers a separation space between the first dam 120a and the second dam 120b. In addition, a barrier layer that includes an inorganic material is further disposed on the planarization layer 500.

Figure 9:
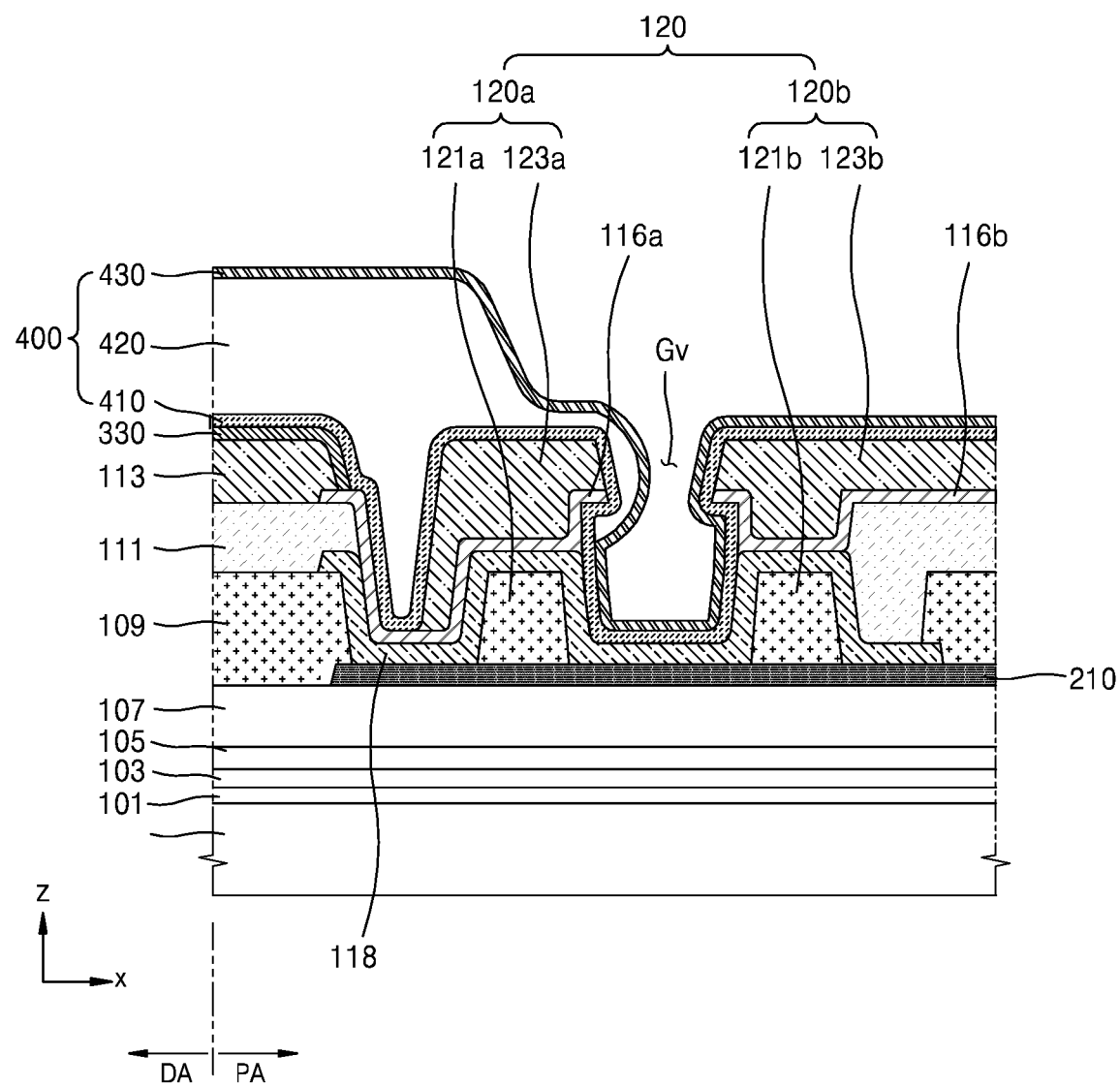
FIG. 9 is a cross-sectional view of a display device according to another embodiment.

FIG. 9 is a cross-sectional view of a display device according to another embodiment. In FIG. 9, same reference numerals represent the same members as those of FIG. 3, and thus a repeated description of the same members is omitted.

Referring to FIG. 9, a display device according to an embodiment includes a display element (see FIG. 3) disposed in the display area DA of the substrate 100, the thin-film encapsulation layer 400 that covers the display element, and the groove Gv with an undercut structure formed in the peripheral area PA of the substrate 100.

In a present embodiment, the first layers 121a and 121b include the same material as the bottom via layer 109. The intermediate conductive layer 118 includes a conductive material and is interposed between the first layers 121a and 121b and top conductive layers 116a and 116b.

To form the groove Gv of a present embodiment, the first layers 121a and 121b are formed by depositing and etching, the first insulating layer. Next, the second layers 123a and 123b and the top conductive layers 116a and 116b are formed by sequentially depositing the intermediate conductive layer 118, a second insulating layer, a first conductive layer, and a third insulating layer and simultaneously etching the third insulating layer and the first conductive layer. Next, the second insulating layer is removed by forming a photoresist on the top conductive layer 116 and the second layers 123a and 123b and then etching the second insulating layer using the photoresist as a mask. The etching includes dry etching. Therefore, a multi-layer structure is formed that includes the first layers 121a and 121b and the intermediate conductive layer 118, and an undercut is formed by the extension of the second layers 123a and 123b and the top conductive layers 116a and 116b toward the center of the groove Gv.

According to an embodiment, the groove Gv is formed by the first dam 120a and the second dam 120b being spaced apart from each other. The first layers 121a and 121b of the first and second dams 120a and 120b include the same material as the bottom via layer 109. The intermediate conductive layer 118 includes a conductive material and is interposed between the first layers 121a and 121b and the top conductive layers 116a and 116b and extends under the groove Gv.

According to an embodiment the intermediate conductive layer 118 and the top conductive layers 116a and 116b include a metal and have excellent adhesion.

Figure 10:
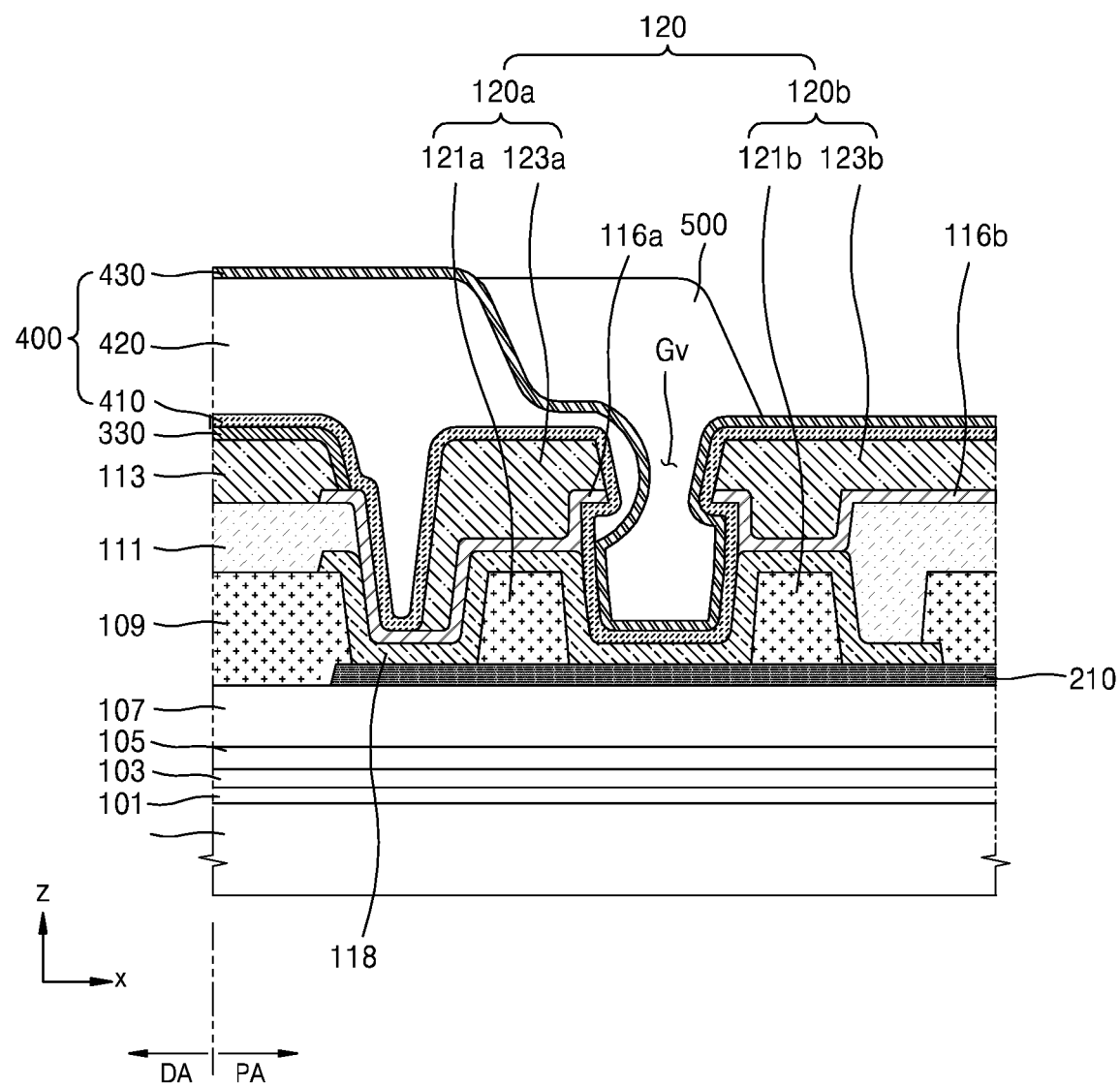
FIG. 10 is a cross-sectional view of a display device according to another embodiment.

FIG. 10 is a cross-sectional view of a display device according to another embodiment. In FIG. 10, same reference numerals represent the same members as those of FIG. 9, and thus a repeated description of the same members is omitted.

Referring to FIG. 10, a display device according to an embodiment includes a display element (see FIG. 3) disposed in the display area DA of the substrate 100, the thin-film encapsulation layer 400 that covers the display element, and the groove Gv with an undercut structure formed in the peripheral area PA of the substrate 100.

A present embodiment includes the planarization layer 500 that includes an organic insulating material and covers the groove Gv with the concave undercut-shaped cross-section. The planarization layer 500 can alleviate stress at the groove Gv and prevent cracks. In addition, a barrier layer that includes an inorganic material is further disposed on the planarization layer 500.

According to an embodiment, the groove Gv is formed by the first dam 120a and the second dam 120b being spaced apart from each other.

Referring to FIG. 10, according to an embodiment, the planarization layer 500 includes an organic insulating material and covers a separation space between the first dam 120a and the second dam 120b. The planarization layer 500 can alleviate stress at the dam unit 120 and prevent cracks.

According to above-described embodiments, since a groove with an undercut structure is formed in the peripheral area, an edge tail of an organic encapsulation layer can be minimized by a capillary phenomenon.

It should be understood that exemplary embodiments described herein should be considered in a descriptive sense only and not for purposes of limitation. Descriptions of features or aspects within each embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display device, comprising:
a substrate that includes a display area that displays an image and a peripheral area outside the display area;
a display element disposed in the display area and that includes a pixel electrode, an emission layer, and an opposite electrode, wherein the pixel electrode is connected to a thin film transistor;
a thin-film encapsulation layer that covers the display element and includes a first inorganic encapsulation layer, an organic encapsulation layer, and a second inorganic encapsulation layer that are sequentially stacked; and
at least one groove formed in the peripheral area,
wherein at least a portion of the thin-film encapsulation layer fills the at east one groove,
wherein the at least one groove is concave into a multi-layer structure that includes a first layer and a second layer disposed on the first layer, the at least one groove has an undercut structure in which the second layer protrudes toward a center of the at least one groove,
wherein a portion of the organic encapsulation layer fills the inside of the at least one groove, and
the first inorganic encapsulation layer and the second inorganic encapsulation layer contact each other inside the at least one groove.

2. The display device of claim 1, further comprising:
a planarization layer that covers the at least one groove and includes an organic insulating material, wherein at least a portion of the planarization layer overlaps the organic encapsulation layer.

3. The display device of claim 2, further comprising:
a barrier layer disposed on the planarization layer and that includes an inorganic material.

4. The display device of claim 1,
wherein the at least one groove includes a first groove and a second groove,
wherein the second groove is farther away from the display area than the first groove, and the first groove is filled with the organic encapsulation layer, and
the second groove is filled with a portion of the organic encapsulation layer.

5. The display device of claim 1, further comprising:
a via layer disposed between the thin film transistor and the display element; and
a pixel-defining layer that covers edges of the pixel electrode,
wherein the first layer includes a same material as the via layer, and
the second layer includes a same material as the pixel-defining layer.

6. The display device of claim 5, further comprising:
a top conductive layer interposed between the first layer and the second layer, wherein the top conductive layer includes the same material as that of the pixel electrode.

7. The display device of claim 6, wherein
the via layer includes a top via layer and a bottom is layer,
the first layer includes the same material as the bottom via layer, and
further comprising
an intermediate layer interposed between the first layer and the top conductive layer, wherein the intermediate layer includes the same material as the top via layer, and a bottom conductive layer disposed under the first layer, wherein a bottom surface of the at least one groove is a top surface of the bottom conductive layer.

8. The display device of claim 6, wherein
the via layer includes a top via layer and a bottom via layer,
the first layer includes the same material as the bottom via layer, and
further comprising
an intermediate conductive layer interposed between the first layer and the top conductive layer, wherein the intermediate conductive layer includes a conductive material.

9. The display device of claim 1, further comprising:
an intermediate conductive layer disposed under the first layer, wherein a bottom surface of the at least one groove is a top surface of the intermediate conductive layer.

10. A display device, comprising:
a substrate that includes a display area that displays an image and a peripheral area outside the display area;
a display element disposed in the display area and that includes a pixel electrode, an emission layer, and an opposite electrode, wherein the pixel electrode is connected to a thin film transistor;
a thin-film encapsulation layer that covers the display element and includes a first inorganic encapsulation layer, an organic encapsulation layer, and a second inorganic encapsulation layer that are sequentially stacked; and
a dam unit formed in the peripheral area and that includes a first dam and a second dam spaced apart from each other, wherein at least one of the first dam and the second dam has an undercut structure,
a via layer interposed between the thin film transistor and the display element; and
a pixel-defining layer that covers edges of the pixel electrode,
wherein each of the first dam and the second dam includes a first layer and a second layer disposed on the first layer,
the first layer includes a same material as the via layer, and
the second layer includes the same material as the pixel-defining layer.

11. The display device of claim 10, wherein
a portion of the organic encapsulation layer fills a separation space between the first dam and the second dam, and
the first inorganic encapsulation layer and the second inorganic encapsulation layer contact each other in the separation space.

12. The display device of claim 1, further comprising:
a planarization layer that covers the dam unit and includes an organic insulating material, wherein at least a portion of the planarization layer overlaps the organic encapsulation layer.

13. The display device of claim 12, further comprising:
a barrier layer disposed on the planarization layer and that includes an inorganic material.

14. The display device of claim 10, further comprising:
a third dam located farther away from the display area than the first dam and the second dam,
wherein the organic encapsulation layer fills a separation space between the first dam and the second dam, and a portion of the organic encapsulation layer fill a separation space between the second dam and the third dam.

15. The display device of claim 10, further comprising:
a top conductive layer interposed between the first layer and the second layer, wherein the top conductive layer includes the same material as the pixel electrode.

16. The display device of claim 15, wherein
the via layer includes a top via layer and a bottom via layer,
the first layer includes the same material as the bottom via layer, and
further comprising
an intermediate layer interposed between the first layer and the top conductive layer, wherein the intermediate layer includes a same material as that of the top via layer.

17. The display device of claim 15, wherein
the via layer includes a top via layer and a bottom via layer,
the first layer includes the same material as the bottom via layer, and
further comprising
an intermediate conductive layer interposed between the first layer and the top conductive layer, wherein the intermediate conductive layer includes a conductive material.

18. A display device, comprising:
a substrate that includes a display area that displays an image and a peripheral area outside the display area;
a display element disposed in the display, area and that includes a pixel electrode, an emission layer, and an opposite electrode, wherein the pixel electrode is connected to a thin film transistor;
a thin-film encapsulation layer that covers the display element and includes a first inorganic encapsulation layer, an organic encapsulation layer, and a second inorganic encapsulation layer that are sequentially stacked;
a dam unit formed in the peripheral area and that includes a first dam and a second dam spaced apart from each other; and
at least one groove formed in the peripheral area between the first dam and the second dam, wherein at least a portion of the thin-film encapsulation layer fills the at least one groove, and the at least one groove has an undercut structure, wherein
a portion of die organic encapsulation layer fills the at least one groove between the first dam and the second dam, and
the first inorganic encapsulation layer and the second inorganic encapsulation layer contact each other in the at least one groove.

* * * * *